United States Patent [19]

Stephan

[11] Patent Number: 4,730,661
[45] Date of Patent: Mar. 15, 1988

[54] PROCESS AND DEVICE FOR MELTING AND REMELTING METALS IN PARTICLE FORM INTO STRANDS, ESPECIALLY INTO SLABS

[75] Inventor: Herbert Stephan, Bruchköbel, Fed. Rep. of Germany

[73] Assignee: Leybold-Heraeus GmbH, Rodgau, Fed. Rep. of Germany

[21] Appl. No.: 890,400

[22] Filed: Jul. 25, 1986

[30] Foreign Application Priority Data

Aug. 1, 1985 [DE] Fed. Rep. of Germany ....... 3527628

[51] Int. Cl.⁴ .................... B22D 11/04; B22D 11/10
[52] U.S. Cl. .................................. 164/469; 164/506
[58] Field of Search ............... 164/469, 506, 494, 512, 164/474

[56] References Cited

U.S. PATENT DOCUMENTS

| Re. 27,945 | 3/1974 | Hunt et al. | 164/512 |
| 3,157,922 | 11/1964 | Gruber | 164/494 |
| 3,234,606 | 2/1966 | Smith, Jr. | 164/512 |
| 3,247,554 | 4/1966 | Hanks et al. | 164/469 X |
| 3,342,250 | 9/1967 | Treppschuh et al. | 164/469 |
| 3,764,297 | 10/1973 | Coad et al. | 164/469 X |

Primary Examiner—Nicholas P. Godici
Assistant Examiner—J. Reed Batten, Jr.
Attorney, Agent, or Firm—Felfe & Lynch

[57] ABSTRACT

Metal particles are remelted in a fusion zone by electron beam bombardment and formed in a continuous casting mould. Furthermore, (a) the metal particles are evenly distributed over the horizontally positioned floor of a fusion ladle,
(b) the metal particles are joined together into a plate-shaped structure by means of the electron beam, whereafter
(c) the floor of the fusion ladle is moved into a position inclined in relation to the horizontal,
(d) the electron beam is guided upwards over the sloping, plate-shaped particle structure so that this is firstly preheated and fused directly thereafter, while
(e) the molten metal running over the lower part of the floor is simultaneously kept liquid by electron beam bombardment, whereafter
(f) the electron beam is guided back downwards over the sloping floor of the fusion ladle, and
(g) the floor of the fusion ladle is returned to the horizontal starting position and is once again charged with metal particles according to feature (a).

10 Claims, 5 Drawing Figures

PROCESS AND DEVICE FOR MELTING AND REMELTING METALS IN PARTICLE FORM INTO STRANDS, ESPECIALLY INTO SLABS

The invention relates to a process for melting down and remelting metals in particle form, these metals being conveyed in the horizontal direction to a melting zone and melted by electron beam bombardment, whereupon the molten metal is fed to a continuous casting mould, from which the metal is drawn off in the form of a solidified strand.

The particles may be a more or less fine granulate originating from a production process effected upstream. When titanium is used as the starting material, it is titanium sponge which is often employed as the starting material.

It is known from U.S. Pat. No. 2,963,530 to transport metal granulate through a horizontal tube by means of a screw conveyor, an electron beam source being arranged at the end of the tube, which end is located in a vacuum chamber. In this way the particles facing the electron beam source are melted superficially, and the molten metal drips into a continuous casting mould arranged in the fall path of the drops. A solidified metal strand is continuously drawn off from the bottom of the mould. The falling drops of molten metal cause considerable spattering of the molten metal present in the upper region of the continuous casting mould. However, it is above all not impossible for unmelted metal particles to fall into the pool of molten metal, where they melt, explosively releasing occluded gases and impurities which evaporate easily in the vacuum and thereby causing even greater spattering of the molten metal. It is similarly not impossible, however, for unmelted metal particles to be included in the molten metal and consequently in the finished strand, which particles disturb further working and lead to rejects among the end products because of the impurities still contained in them. This danger is particularly great if, owing to the process, the molten metal pools being worked with are particularly shallow.

It should furthermore be noted that the purifying effect of vacuum processes is based on precisely the fact that the surfaces of the finest possible particles of molten metal are exposed to the vacuum for as long as possible. This requirement was not or only very unsatisfactorily fulfilled in previous direct treatment of metal particles or granules.

In the past, therefore, one has had to make do with firstly producing from the starting material consumable electrodes which are also relatively safe to handle in vacuo. These consumable electrodes were then melted down by means of electron bombardment and conveyed in drop form and by free fall to a pool of molten metal located at the top of a cast strand in a strand mould. It is also known to connect an intermediate ladle upstream of the actual continuous casting mould and also heated by electron beams, so that the casting process itself can be better controlled.

The above-described process is relatively costly, however, owing to the process for producing the consumable electrode, which process must also be carried out in vacuo. The process must, moreover, be supplied twice with heat of fusion, that is to say once for the production of the consumable electrode and a second time for remelting into the (purified) strand.

To reduce energy consumption, consumable electrodes have already been produced from particles in such a way that the particles were only superficially melted and then allowed to fall into a continuous casting mould where they joined together superficially and formed a type of sintered body. The problems of the particular preliminary process for producing the consumable electrodes basically remained, however, and the additional problem was added thereto that the consumable electrodes concerned could no longer be exposed to the atmosphere in between times because of their inevitable porosity, as this would have led to an undesirably great absorption of gas. In vacuo, occluded gases lead inevitably to outgasing processes, which considerably impair the usual course of the process.

The problem on which the invention is based, therefore, is the provision of a process of the above-described type for the direct treatment of metal particles, in which particles of the molten metal do not splash around and the effect of unmelted metal particles in the strand produced is definitely avoided.

According to the invention the problem set is solved for the above-described process in that:

(a) the metal particles are scattered from a horizontally displaceable conveying device substantially evenly over the horizontally positioned floor of a fusion ladle, (b) the particles are joined together into a plate-shaped structure by means of the electron beam which momentarily melts the surfaces of these particles, whereafter (c) the floor of the fusion ladle is moved into a position inclined relative to the horizontal and (d) the electron beam is guided upwards over the sloping, plate-shaped particle structure, the energy density of the beam being so distributed that the particle structure is firstly preheated in strips and fused directly thereafter, while (e) the molten metal running over the lower part of the floor is simultaneously kept liquid by electron beam bombardment, whereafter (f) the electron beam is guided back downwards over the sloping floor of the fusion ladle while the molten metal is being largely removed, and (g) the floor of the fusion ladle is returned to the horizontal starting position and is once again charged with metal particles according to feature (a).

By means of feature (a)—or a step effected upstream—the metal particles are firstly outgassed, the gases absorbed at the surface, including the very troublesome water vapour, being removed. Moreover, the metal particles are distributed in a relatively thin layer over a relatively large area corresponding to the surface of the ladle floor. Furthermore, the batch of particles is preferably applied in two or more layers. Thus, for example, a first particle layer can be melted by electron bombardment and create a film of molten metal of pasty consistency loosely adhered to the ladle floor, onto which first film a second layer of metal particles is subsequently applied which coalesces therewith. However, it is also possible to heat a single (thicker) particle layer from above with the electron beam and by this means to effect an agglomeration or coalescence. Finally, it is also possible to leave behind on the ladle floor a remainder of molten metal from a previous process cycle and to apply a further particle layer to the ladle floor with or without simultaneous electron beam heating.

In any case, a plate or board-shaped particle structure is created by the previous and/or subsequent heating of the contents of the fusion ladle which is sufficiently strong to make possible the subsequent process steps of the immediate further treatment in the same vacuum process or the same vacuum chamber.

The sprinkling of metal particles over a film of molten metal, which latter originates for example from the previous process cycle, has the considerable advantage that the metal particles land with a plastic impact, and are thus unable to rebound.

Feature (c) has the advantage that the plate-shaped particle structure can be fused in zones and continuously from a narrow side, while at least the major part of the molten metal is able simultaneously to flow off over the increasingly large free surface of the ladle floor or over the lower edge thereof.

Feature (d) exhibits the advantage that the particle structure is firstly further degassed in the preheating stage, the remaining moisture thereby being evaporated and the distilling off of volatile elements thereby being begun. During the immediately subsequent fusion stage annoying impurities are almost completely evaporated. Furthermore, according to feature (e) the molten metal running over the lower part of the floor is kept liquid during fusion and simultaneously therewith by electron beam bombardment and is then further degassed.

After the particle structure has been completely melted it is advantageous, but not absolutely necessary, for the inclination of the fusion ladle to be increased, for example from 45 degrees to 60 degrees. In this way the draining off of the remaining molten metal still present on the ladle floor down to a thin film of molten metal is further promoted.

Feature (f) also aids extensive draining off: the electron beam not only reduces the viscosity of the molten metal by superheating, but also has a certain stripping effect whereby the molten metal is urged along in front of the heating zone, which is now travelling downwards once again.

The process step according to feature (g) results in the return of the fusion ladle to its starting position so that a new solidifying, prepurification and melting cycle can begin.

An essential component of the process cycle according to features (a) to (g) is the use of an electron beam. An electron beam of this type, for which standard electron guns are available with suitable X-Y sweeping systems, can be swept over a target area with selective distribution of the energy density within an "impact pattern", as is known from television screens. Thus, for example, the varying energy density in different zones can be obtained by causing the electron beam to dwell for different periods in individual zones. It can also be achieved by sweeping the electron beam through the individual zones in zig-zag patterns of differing densities. Owing on the one hand to the high sweep frequency within the individual zones and on the other hand to the similarly high repetition frequency over the whole sweep pattern, there arises a quasi-stationary state to which the thermal inertia of the material hit by theelectron beam also clearly contributes. Details of the creation of an impact pattern of the above type, although for a different purpose, are described in DE-OS No. 28 12 285.

Furthermore, it is especially advantageous, according to another embodiment of the invention for the electron beam to be split up for process steps (d) and (e) into three strip-like zones of varying densities, that is to say:

upper zone I: average energy density for heating in strips the plate-shaped particle structure, middle zone II: high energy density for melting in strips the plate-shaped particle structure, lower zone III: low energy density for keeping liquid the molten metal running over the lower part of the ladle floor, zone III so spreading as zones I and II progress upwards that it extends over the whole of the lower part of the floor.

Another advantageous embodiment of the process according to the invention consists in the fact that the electron beam is split up for process step (f) into three strip-like zones of varying energy densities, these being:

lower zone IV: low energy density to keep liquid the molten metal running over the respective part of the floor, middle zone V: high energy density for stripping the remaining material from the floor (preferably higher than for the melting in zone II), upper zone VI: very low energy density to keep the floor warm, zone IV so diminishing as zone V progresses downwards that its range remains restricted to the lower part of the floor, and zone VI so increasing in size as zone V progresses downwards that it extends over the whole upper part of the floor.

The invention also relates to a device for carrying out the process according to the invention. This device comprises, in the conventional way, a horizontally operating conveying device with a discharge edge for the particles, an electron beam source for bombarding the particles with melting energy and a continuous casting mould.

To solve the same problem this device is characterized by the following features:

(a) a fusion ladle swivellable around a horizontal axis between a horizontal floor position and at least one floor position inclined in relation to the horizontal, over which fusion ladle, when it is in its horizontal position, the discharge edge of the conveying device may be transported, (b) at least one electron beam source targeted on the fusion ladle and having a dynamic X-Y sweeping device; and (c) a control unit provided for the electron beam source for the control of intensity and for sweeping the beam during process steps (d), (e) and (f).

It is especially advantageous for the floor of the fusion ladle to be provided with ribs running substantially parallel to the swivel axis. In this way the particle structure is held reliably in its abovementioned sloping position and the molten metal draining off over the ribs is additionally swirled so that its surface is very effectively exposed to the purifying vacuum.

Other advantageous embodiments of the subject matter of the invention will emerge from the remaining subclaims.

One embodiment of the subject matter of the invention will be described in greater detail below with the aid of FIGS. 1 to 5, in which:

FIG. 1 shows a vacuum chamber 1, which can be put under the operating vacuum usual for such processes of from $10^{-2}$ to $10^{-4}$ mbar by vacuum pumps and an evacuation pipe, none of which is shown.

Figure 1:
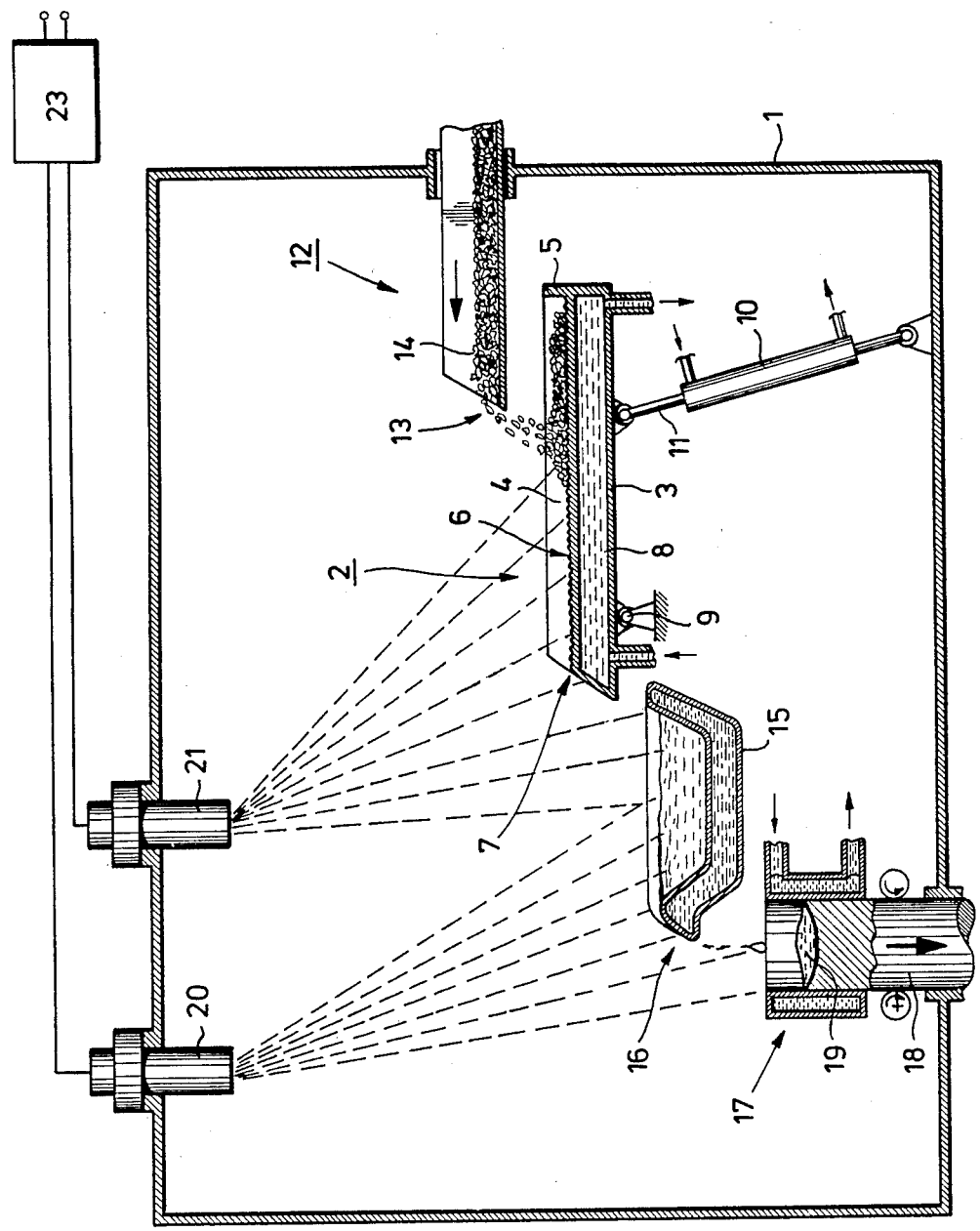
FIG. 1 shows a vertical section through a complete device during the charging stage.

In the vacuum chamber 1 there is located a fusion ladle 2, which is the crux of the invention. The fusion ladle 2 consists of an elongate, water-cooled hollow body 3 with upstanding side walls 4 and a likewise upstanding rear end wall 5. Copper is preferably used as the construction material. A floor 6 with ribs (not further described) serves to receive the metal particles to be remelted and simultaneously forms the upper defining wall of the hollow chamber 8 located therebelow and having water flowing through it. The floor 6 comprises a lower lip 7 which is at the same time the overflow edge for the molten metal.

In the region of the lip 7, the fusion ladle 2 is supported on a horizontal shaft 9 and in the region of the end wall 5 it is connected to a lifting drive 10 whose piston rod 11 bears upon the hollow body 3. By this means it is possible to move the fusion ladle 2 at will into a horizontal position or a position at 45 or 60 degrees to the horizontal. (The position indicated relates each time to the spacial position of the floor 6.)

When the fusion ladle 2 is in the horizontal position (FIG. 1) a horizontally operating conveying device 12 with a discharge edge 13 is located thereabove. The conveying device 12 can be, for example, a vibratory conveyor or comprise some other mechanical device for feeding the metal particles 14. The hermetically sealed supply bin located outside the vacuum chamber is not shown.

Below the lip 7 or overflow edge there is located a water-cooled intermediate ladle 15 which converts the intermittent operation of the fusion ladle 2 into a continuous pouring process by its storage volume. To this end, the intermediate ladle 15 has a pouring lip 16, which is arranged centrally above a continuous casting mould 17. In the continuous casting mould 17 there are located a strand 18, which functions as the lower closure of the continous casting mould, and, at the upper end of the strand, a pool of molten metal 19, which is supplied continuously from the intermediate ladle 15. In this way a material and energy or heat balance is obtained, which is maintained for the entire duration of the remelt process. A lack in supply from the fusion ladle 2 can be compensated by a slight tilting of the intermediate ladle 15.

Two electron beam sources 20 and 21 are provided to heat the whole device, the electron beam source 21 being allocated to the fusion ladle 2. The electron beams are indicated by broken lines; it goes without saying, however, that the electron beams are focussed and do not simultaneously cover the area shown, rather they are guided according to the sweep and repetition frequency, over their target surfaces. Details relating to the impact pattern of the electron beams are described still more closely with the aid of the remaining Figures.

Uniform charging of the receiving ladle 2 is achieved by moving the conveying device 12 to and fro, it being possible, as described above, to effect the charging process in several layers and possibly with intermediate heating by electron beams.

Figure 2:
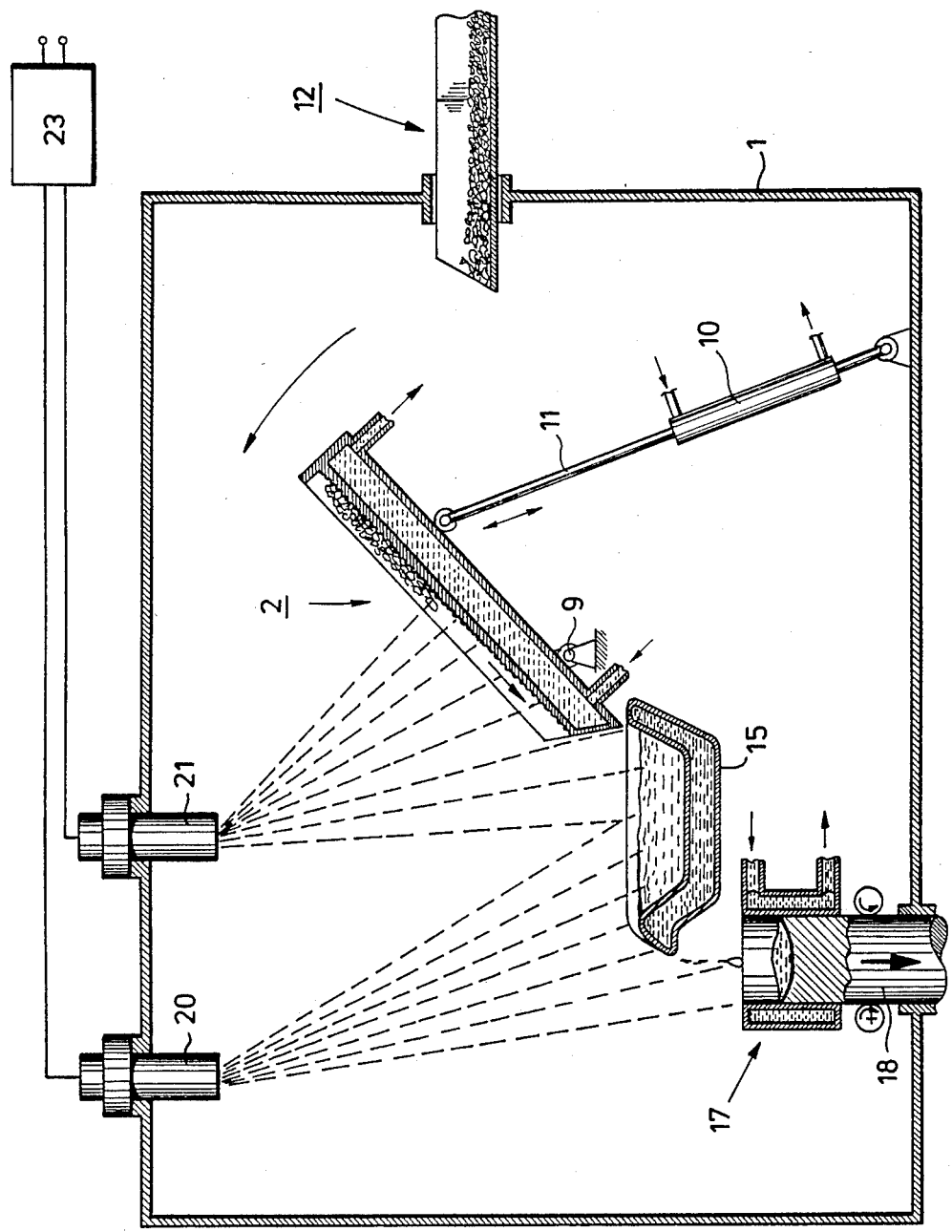
FIG. 2 shows the device of FIG. 1 at the fusion stage.

As soon as the conveying device 12 is withdrawn, the fusion ladle 2 can be moved into the position according to FIG. 2 by pivoting around its horizontal shaft 9, the floor 6 in FIG. 2 being aligned at an angle of 45 degrees to the horizontal. This is the most suitable position for the purifying and fusing process, which will be described in still greater detail with the aid of FIGS. 4 and 5.

Figure 3:
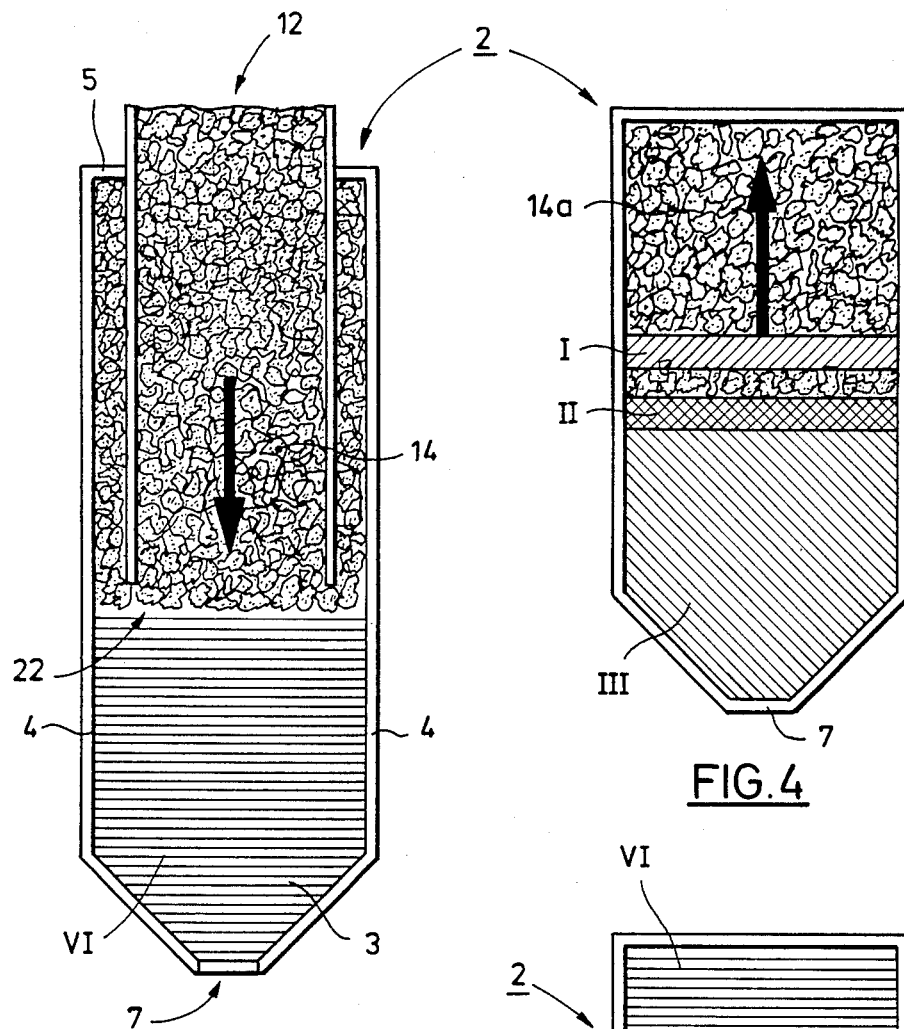
FIG. 3 is a plan view of the fusion ladle and the conveying device during the charging stage.

Firstly, FIG. 3 shows a plan view of the fusion ladle 2 in its horizontal position. The conveying device 12 is displaced from the rear end wall 5 in the direction of the lip 7, metal particles 14 being simultaneously thrown off onto the floor of the fusion ladle 2. In order to make it easier for the melt subsequently to flow off, the hollow body 3 is tapered in the direction of the front lip 7, bringing about a funnel effect. The fusion ladle in FIG. 2 is approximately 3/5 full of metal particles 14, the part of the floor 6 which is not as yet covered with metal particles is bombarded with energy of very low density, so as to keep the floor 6 at the required operating temperature.

Figure 4:
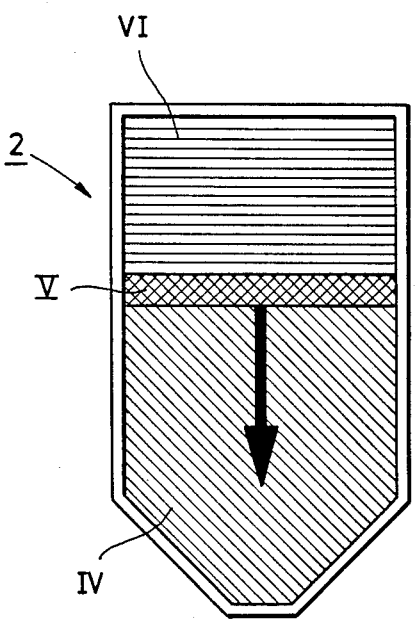
FIG. 4 is a plan view of the fusion ladle during the fusion stage.

FIG. 4 is a plan view, seen from vertically above, of the fusion ladle 2 which is now aligned at an angle of 45 degrees (which is why is appears shortened to the viewer). The metal to be melted, which has in the meantime solidified into a particle structure, is located in the rear upper part of the fusion ladle 2, the electron beam, in the long term, travelling gradually upwards over it. In this way, an upper zone I is formed, in which an average energy density is present to preheat, in strips, the plate-shaped particle structure. A zone II follows zone I and has a higher energy density for melting, in strips, the plate-shaped particle structure 14a. It is not essential for the space shown in FIG. 4 to exist between zones I and II—the zones can follow each other directly. However, in order not to have to accept a considerable degree of overheating in any zone, it is recommended that a slight space between the two zones be retained. Zone III follows zone II and has a very low energy density, this being sufficient to keep liquid the molten metal which is at the time flowing over the lower part of the floor. Zone III is indicated by diagonal hatching. While zones I and II always have the same width (the longitudinal axes of the strips each run horizontally from wall to wall) and only zone I can be switched off on reaching the upper edge or end wall, zone III spreads upwards according to the progress of zones I and II in such a way that it extends over the whole, particle-free, lower part of the floor to its lip 7.

Figure 5:
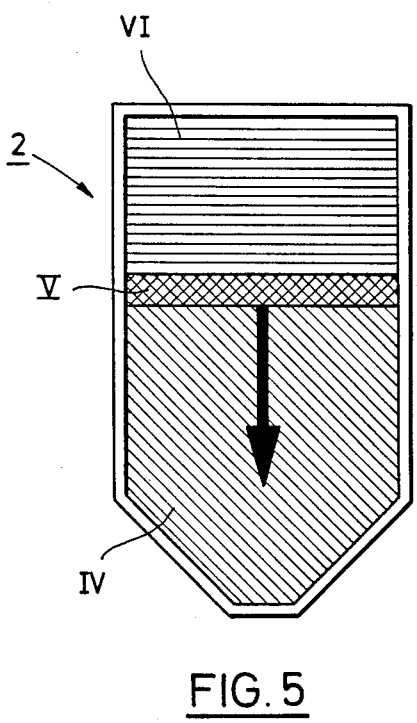
FIG. 5 is a plan view of the fusion ladle during the molten metal stripping stage.

FIG. 5 shows the conditions after reversal of the direction of travel of the electron beam, i.e. after the whole particle structure 14a of FIG. 4 has been fused. During this stage of the process the fusion ladle 2 is in an even steeper position at an angle of pitch of 60 degrees to the horizontal, so that it seems still shorter to the viewer looking down from vertically above. In the lower zone IV a low energy density prevails which is just sufficient to keep liquid the molten metal running over the part of the floor in question. This energy density is substantially the same as that present in zone III of FIG. 4. The increasingly small zone IV is followed by a zone V of higher energy density, which is preferably even higher than the energy density in zone II (fusion zone) of FIG. 4. The choice of such a high energy density serves to strip off virtually all the remaining material from the floor, such that at most a film of molten metal remains, which effects the adhesion of subsequently sprinkled metal particles. Zone V is followed by an upper zone VI in which a very low energy density is present which is sufficient to keep the floor warm and the film of molten metal liquid. It goes without saying that zone IV diminishes in size in accordance with the downward progress of zone V in such a way that its extension over the lower part of the floor remains restricted. Conversely, the zone following zone V, i.e. zone VI, increases in size in accordance with the downward progress of zone V in such a way that it spreads over the whole upper part of the floor. The upper zone VI is indicated by horizontal lines.

If the fusion ladle has now been pivoted back from the position shown in FIG. 5 into the horizontal position of FIG. 3 and the conveying device 12 is pushed forwards from the rear over the fusion ladle 2, the heating in the rear part of the fusion ladle 2, i.e. the extension of zone VI, must of course be withdrawn, as is shown in FIG. 3 by the horizontal lines. The rear edge of zone VI is indicated in FIG. 3 by 22.

FIGS. 1 and 2 show two electron beam sources 20 and 21, the electron beam source 21 being allocated to the fusion ladle 2. It goes without saying, however, that the fusion ladle 2 can also have several electron beam sources allocated to it, these being mutually complementary. Thus it is possible, for example, to provide zones I/VI or II/V or III/IV each with their own electron beam source, these sources having correspondingly. synchronized sweeping systems. References to the electron beam source 21 include such measures. A control unit 23 is provided for the control of these electron beam sources with respect to beam intensity and beam movement, the design of this control unit 23 being obvious to one skilled in the art from the above description of the process. It is not therefore necessary to reproduce circuit diagrams.

I claim:

1. A process for melting and remelting metals in particle form, these metals being conveyed in the horizontal direction to a melting zone and melted by electron beam bombardment, whereupon the molten metal is fed to a continuous casting mould, from which the metal is drawn off in the form of a solidified strand, the process comprising the steps of:
    (a) scattering the metal particles from a horizontally displaceable conveying device substantially evenly over the horizontally positioned floor of a fusion ladle;
    (b) joining the particles together into a plate-shaped structure by means of the electron beam which momentarily melts the surfaces of these particles;
    (c) moving the floor of the fusion ladle into a position inclined relative to the horizontal;
    (d) guiding the electron beam upwards over the sloping, plate-shaped particle structure, the energy density of the beam being so distributed that the particle structure is firstly preheated in strips and fused directly thereafter;
    (e) simultaneously keeping the molten metal the lower part of the floor liquid by electron beam bombardment;
    (f) guiding the electron beam back downwards over the sloping floor of the fusion ladle while removing the molten metal; and
    (g) returning the floor of the fusion ladle to the horizontal starting position and again charging the fusion ladle with metal particles according to step (a).

2. A process according to claim 1, characterized in that the electron beam is split up for steps (d) and (e) into three strip-like zones of varying energy densities, that is to say:
    upper zone I: average energy density for heating in strips the plate-shaped particle structure,
    middle zone II: high energy density for melting in strips the plate-shaped particle structure,
    lower zone III: low energy density for keeping liquid the molten metal running over the lower part of the ladle floor,
    zone III so spreading as zones I and II progress upwards that it extends over the whole of the lower part of the floor.

3. A process according to claim 2, characterized in that on reaching the upper edge of the floor zone I is switched off.

4. A process according to claim 1, characterized in that the electron beam is split up for step (f) into three strip-like zones of varying energy densities, these being:
    lower zone IV: low energy density for keeping liquid the molten metal running over the respective part of the floor,
    middle zone V: high energy density for stripping the remaining material from the floor,
    upper zone VI: very low energy density for keeping the floor warm,
    zone IV so diminishing as zone V progresses downwards that its range remains restricted to the lower part of the floor, and zone VI so increasing in size as zone V progresses downwards that it extends over the whole upper part of the floor.

5. A process according to claim 4, characterized in that on reaching the lower edge of the floor the lower zone IV is switched off.

6. A process according to claim 4, characterized in that the upper zone VI remains switched on until the floor swivels back into the horizontal position after step (g) and that its edge which faces the conveying direction withdraws as the conveying device is pushed forward.

7. A process according to claim 1, characterized in that the molten metal running out of the fusion ladle is firstly caught in an intermediate ladle, whence it is supplied continuously to the continuous casting mould.

8. A device for carrying out the process of claim 1, comprising a horizontally operating conveying device with a discharge edge for the particles, an electron beam source for bombarding the particles with melting energy and a continuous casting mould, characterized by
    a fusion ladle (2) swivellable around a horizontal axis (9) between a horizontal position of the floor (6) and at least one floor position inclined relative to the horizontal, over which fusion ladle (2), when it is in its horizontal position, the discharge edge (13) of the conveying device (12) may be displaced,
    at least one electron beam source (20, 21) allocated to the fusion ladle (2) and having a dynamic X-Y sweeping device, and
    a control unit (23) provided for the electron beam source (20, 21) for the control of intensity and for sweeping the beam during steps (d), (e) and (f).

9. A device according to claim 8, characterized in that the floor of the fusion ladle (2) is provided with ribs substantial parallel to the swivel axis (9).

10. A device according to claim 8, characterized in that a heatable intermediate ladle (15) is arranged between the draining edge (7) of the fusion ladle (2) and the continuous casting mould (17).

* * * * *

UNITED STATES PATENT AND TRADEMARK OFFICE
CERTIFICATE OF CORRECTION

PATENT NO. : 4,730,661

DATED : March 15, 1988

INVENTOR(S) : Herbert Stephan

It is certified that error appears in the above-identified patent and that said Letters Patent is hereby corrected as shown below:

Column 7, line 57: after "metal" insert -- running over --.

Signed and Sealed this

Twenty-seventh Day of December, 1988

Attest:

DONALD J. QUIGG

Attesting Officer

Commissioner of Patents and Trademarks